(12) United States Patent
Scharf et al.

(10) Patent No.: US 9,263,425 B2  
(45) Date of Patent: Feb. 16, 2016

(54) SEMICONDUCTOR DEVICE INCLUDING MULTIPLE SEMICONDUCTOR CHIPS AND A LAMINATE

(71) Applicant: Infineon Technologies Austria AG, Villach (AT)

(72) Inventors: Thorsten Scharf, Regensburg (DE); Petteri Palm, Regensburg (DE); Angela Kessler, Sinzing (DE)

(73) Assignee: Infineon Technologies Austria AG, Villach (AT)

(*) Notice: Subject to any disclaimer, the term of this patent is extended or adjusted under 35 U.S.C. 154(b) by 37 days.

(21) Appl. No.: 14/102,625

(22) Filed: Dec. 11, 2013

(65) Prior Publication Data

US 2015/0162319 A1 Jun. 11, 2015

(51) Int. Cl.
*H01L 23/48* (2006.01)
*H01L 25/18* (2006.01)
*H01L 23/31* (2006.01)
*H01L 23/552* (2006.01)
*H01L 23/00* (2006.01)
*H01L 25/00* (2006.01)
*H01L 23/538* (2006.01)

(52) U.S. Cl.
CPC ............ *H01L 25/18* (2013.01); *H01L 23/3121* (2013.01); *H01L 23/3157* (2013.01); *H01L 23/5389* (2013.01); *H01L 23/552* (2013.01); *H01L 24/16* (2013.01); *H01L 24/24* (2013.01); *H01L 24/29* (2013.01); *H01L 24/45* (2013.01); *H01L 24/82* (2013.01); *H01L 25/50* (2013.01); *H01L 2224/04105* (2013.01); *H01L 2224/16225* (2013.01); *H01L 2224/45* (2013.01); *H01L 2924/12* (2013.01); *H01L 2924/13055* (2013.01); *H01L 2924/13091* (2013.01); *H01L 2924/1461* (2013.01); *H01L 2924/181* (2013.01); *H01L 2924/2064* (2013.01); *H01L 2924/20641* (2013.01)

(58) Field of Classification Search
CPC . H01L 21/56; H01L 23/3121; H01L 23/3677; H01L 23/492; H01L 23/49844; H01L 23/5389; H01L 24/24; H01L 24/27; H01L 24/29; H01L 24/82; H01L 24/83; H01L 25/16; H01L 24/32; H05K 1/185
USPC .......................................... 257/686, 723, 777
See application file for complete search history.

(56) References Cited

U.S. PATENT DOCUMENTS

| | | | |
|---|---|---|---|
| 2008/0197485 A1* | 8/2008 | Theuss et al. | 257/723 |
| 2010/0019391 A1* | 1/2010 | Strzalkowski | 257/777 |
| 2011/0108971 A1* | 5/2011 | Ewe et al. | 257/686 |

* cited by examiner

*Primary Examiner* — Dung Le  
(74) *Attorney, Agent, or Firm* — Murphy, Bilak & Homiller, PLLC

(57) ABSTRACT

A semiconductor device includes a laminate, a first semiconductor chip at least partly embedded in the laminate, a second semiconductor chip mounted on a first main surface of the laminate, and a first electrical contact arranged on the first main surface of the laminate. The second semiconductor chip is electrically coupled to the first electrical contact.

22 Claims, 5 Drawing Sheets

SEMICONDUCTOR DEVICE INCLUDING MULTIPLE SEMICONDUCTOR CHIPS AND A LAMINATE

TECHNICAL FIELD

The disclosure relates to semiconductor devices including multiple semiconductor chips and a laminate. In addition, the disclosure relates to methods for manufacturing such semiconductor devices.

BACKGROUND

Semiconductor devices may include one or multiple semiconductor chips that may be of different types. In addition, the design of a semiconductor device may be based on a laminate. Semiconductor devices and methods for manufacturing semiconductor devices constantly have to be improved. It may be desirable to improve a performance and a quality of the semiconductor devices. In particular, it may be desirable to increase a degree of integration and to improve an electrical performance of the semiconductor devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

Figure 1:
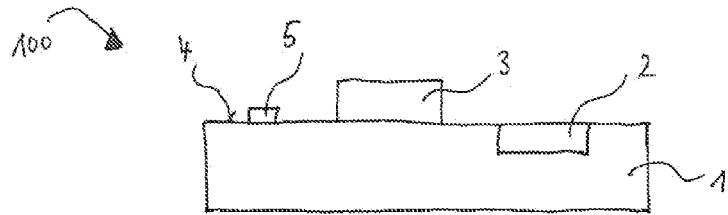
FIG. 1 schematically illustrates a cross-sectional view of a semiconductor device in accordance with the disclosure.

In the following detailed description, reference is made to the accompanying drawings, which form a part hereof, and in which is shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the scope of the present disclosure. The following detailed description, therefore, is not to be taken in a limiting sense, and the scope of the present disclosure is defined by the appended claims.

As employed in this specification, the terms "connected", "coupled", "electrically connected" and/or "electrically coupled" are not meant to necessarily mean that the elements must be directly connected or coupled together. Intervening elements may be provided between the "connected", "coupled", "electrically connected" or "electrically coupled" elements.

Semiconductor devices and methods for manufacturing semiconductor devices are described herein. Comments made in connection with a described semiconductor device may also hold true for a corresponding method and vice versa. For example, if a specific component of a semiconductor device is described, a corresponding method for manufacturing the semiconductor device may include an act of providing the component in a suitable manner, even if such an act is not explicitly described or illustrated in the figures. In addition, the features of the various exemplary aspects described herein may be combined with each other, unless specifically noted otherwise. In this specification, the terms "semiconductor device" and "semiconductor package" may be interchangeably used. In particular, a semiconductor package may be a semiconductor device including an encapsulation material that may at least partly encapsulate one or more components of the semiconductor device.

The semiconductor devices described herein may include one or more semiconductor chips. The semiconductor chips may be of different types and may be manufactured by different technologies. For example, the semiconductor chips may include integrated electrical, electrooptical or electromechanical circuits, passives, etc. The integrated circuits may be designed as logic integrated circuits, analog integrated circuits, mixed signal integrated circuits, power integrated circuits, memory circuits, integrated passives, microelectromechanical systems, etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

The semiconductor chips may include one or more active sides (or active surfaces). An active side of a semiconductor chip may be defined as the physical part of the semiconductor chip containing microelectronic structures or semiconductor structures. For example, an active side may include at least one semiconductor structure, in particular at least one of a diode, a transistor, a fuse, a resistor, a capacitor, etc.

In particular, the semiconductor chips may include one or more power semiconductors. The semiconductor chips (or power semiconductor chips) may have a vertical structure, i.e. the semiconductor chips may be fabricated such that electric currents may flow in a direction perpendicular to the main faces of the semiconductor chips. A semiconductor chip having a vertical structure may have electrodes over or on its two main faces, i.e. over or on its top side and bottom side. In particular, power semiconductor chips may have a vertical structure and may have load electrodes over or on both main faces. For example, the vertical power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), super junction devices, power bipolar transistors, etc. The source electrode and gate electrode of a power MOSFET may be arranged over or on one face while the drain electrode of the power MOSFET may be arranged over or on the other face. The semiconductor devices described herein may further include semiconductor chips or integrated circuits to control and/or drive the integrated circuits of the power semiconductor chips. Compared to power semiconductor chips, such logic chips may be based on a more complex architecture and design.

The semiconductor devices described herein may include one or more semiconductor chips having a low pin count (LPC). For example, a power semiconductor chip, as e.g. a power MOSFET, an IGBT, a JFET, etc., may have a low pin count. In particular, a chip having a low pin count may be at least partly embedded in a laminate of the semiconductor device. The semiconductor devices described herein may further include one or more semiconductor chips having a high pin count (HPC). A chip having a high pin count may particularly be at least partly embedded in a laminate or may be arranged outside of the laminate of the semiconductor device, for example over or on a main surface of the laminate. For example, a logic chip or a memory chip may have a high pin count. In general, a semiconductor chip having a high pin count may include more pins or electrical contacts than a semiconductor chip having a low pin count. Semiconductor chips of different pin counts may be configured to cooperate or communicate with each other during an operation of the semiconductor device. For example, a semiconductor chip with a high pin count may be configured to control and/or drive a semiconductor chip having a low pin count.

The semiconductor chips may have electrical contacts, e.g. in form of contact pads (or contact elements or contact terminals or contact electrodes) which may allow electrical contact to be made with integrated circuits included in the semiconductor chips. For the case of a power semiconductor chip, a contact pad may correspond to a gate electrode, a source electrode, or a drain electrode. The contact pads may include one or more metal layers that may be applied to the semiconductor material. The metal layers may be manufactured with any desired geometric shape and any desired material composition. Any desired metal or metal alloy, for example at least one of aluminum, titanium, gold, silver, copper, palladium, platinum, nickel, chromium, nickel vanadium, etc., may be used as the material. The metal layers need not be homogenous or manufactured from just one material, i.e. various compositions and concentrations of the materials contained in the metal layers may be possible.

The semiconductor devices described herein may include a laminate. The laminate needs not be homogenous or manufactured from just one material, i.e. various compositions and concentrations of the materials contained in the laminate may be possible. For example, the laminate may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, etc. The laminate may be configured to embed electronic components, for example one or more semiconductor chips. In addition, the laminate may be configured to serve as a carrier over or on which electronic components may be arranged or mounted, for example at least one of a semiconductor chip, a passive electronic component, an active electronic component, a microelectromechanical system (MEMS), etc. Various techniques may be employed for manufacturing the laminate and embedding a component like a semiconductor chip in the laminate. For example, at least one of compression molding, injection molding, powder molding, liquid molding, lamination, etc. may be used.

The semiconductor devices described herein may include an encapsulation material that may at least partly cover one or more components of the semiconductor device. The encapsulation material may be electrically insulating and may form an encapsulation body. The encapsulation material may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material, etc. Various techniques may be used to encapsulate components of the semiconductor device with the encapsulation material, for example at least one of compression molding, injection molding, powder molding, liquid molding, lamination, etc.

The semiconductor devices described herein may include one or more passive electronic components. For example, the passive electronic components may be integrated in a semiconductor material. Multi-interconnect metal layers may be employed for implementing passive electronic components. Passive electronic components may include any kind of resistors, capacitors, inductive components like inductors or coils, antennas, etc. Any appropriate technique may be used for manufacturing the passive electronic components.

The semiconductor devices described herein may include one or more active electronic components. The active electronic components may e.g. be integrated in a semiconductor material based on an arbitrary appropriate manufacturing technique. Active electronic components may include any kind of diodes, transistors, digital or analog circuits, optoelectronic components, a MEMS, etc.

The semiconductor devices described herein may be based on a surface mount technology and thus may represent surface mount devices, for example a Ball Grid Array (BGA), a Chip Scale Package (CSP), a Quad-Flat-No-Leads (QFN) package, a Land Grid Array (LGA), etc. A surface mount device may include at least one mounting surface that may serve to mount the semiconductor device onto another component, for example a printed circuit board (PCB). External contact elements and, in particular, external contact surfaces may be disposed over or on the mounting surface to support a surface mounting of the semiconductor device. The external contact elements may allow to electrically couple the semiconductor device to the component over or on which the semiconductor device is to be mounted. Solder deposits, such as solder balls, solder bumps, solder pads, solderable pads, etc., or other appropriate connection elements may be used to establish an electrical and/or mechanical connection between the semiconductor device and the component over or on which the semiconductor device is mounted.

The semiconductor devices described herein may include one or more redistribution layers. For example, a redistribution layer may be arranged over at least one surface of the laminate that may also be included in the semiconductor device. In a further example, a redistribution layer may at least partly be arranged in the laminate. The redistribution layer may include one or more metal layers that may have the shape of conductor lines or conductor planes and may be electrically coupled to a semiconductor chip of the semiconductor device. The metal layers may be employed as wiring layers to make electrical contact with the semiconductor chips from outside the semiconductor device and/or to make electrical contact with other semiconductor chips and/or components contained in the semiconductor device. The metal layers may couple the contact pads of the semiconductor chips to the external contact pads. In a further example, the metal layer may provide an electrical connection through a laminate from one surface of the laminate to another surface of the laminate. The metal layers may be manufactured with any desired geometric shape and any desired material composition. For example, the metal layers may include at least one of aluminum, nickel, palladium, silver, tin, gold, copper, corresponding metal alloys, etc., or combinations thereof. The metal layers may include one or multiple single metal layers made of these materials. Alternatively or additionally, the metal layers may include one or multiple multilayers made of the materials, for example copper/nickel/gold. The metal layers may be arranged above or below or between electrically insulating layers.

The semiconductor devices described herein may include electrically conductive elements that may be configured to provide an electrical connection between components of a semiconductor device. In one example, an electrical connection may be provided between a semiconductor chip and an electrical contact that may both be arranged over or on a laminate. An appropriate element to provide such electrical connection may be at least one of a bond wire, a solder bump, a diffusion solder bond, a conductive glue, etc. The electrically conductive elements may be manufactured from an arbitrary suitable material. An employed bond wire may e.g. include at least one of Cu, Au, Al, Pd-coated Cu, Ag, etc. Solder material capable of forming diffusion solder bonds may e.g. include one or more of Sn, SnAg, SnAu, In, InAg, InAu, SnAgCu, PbSn, PbInAg, etc. In a further example, an electrical connection may be provided between a semiconductor chip at least partly embedded in a laminate and an electrical contact arranged over or on the laminate. Such electrical connection may e.g. be provided by one or more microvias that may be made of an arbitrary suitable electrically conductive material, for example a metal or metal alloy.

FIG. 1 schematically illustrates a cross-sectional view of a semiconductor device 100 in accordance with the disclosure. The semiconductor device 100 may include a laminate 1 and a first semiconductor chip 2 that may be at least partly embedded in the laminate 1. In the example of FIG. 1, the first semiconductor chip 2 is exemplarily embedded at a first main surface 4 of the laminate 1. In other examples, however, the first semiconductor chip 2 may also be embedded at another arbitrary location in the laminate 1, for example at the main surface of the laminate 1 opposite the first main surface 4. The semiconductor device 100 may further include a second semiconductor chip 3 that may be mounted over or on the first main surface 4 of the laminate 1. A first electrical contact 5 may be arranged over or on the first main surface 4 of the laminate 1. The second semiconductor chip 3 may be electrically coupled to the first electrical contact 5. In the example of FIG. 1, the electrical coupling between the second semiconductor chip 3 and the first electrical contact 5 is not explicitly illustrated in order to clarify that the electrical coupling may be of any suitable type. Examples for suitable electrical couplings are described below. In addition, more detailed semiconductor devices similar to the semiconductor device 100 of FIG. 1 are described in the following.

Figure 2:
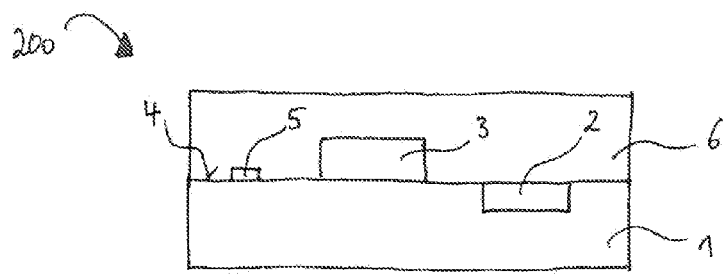
FIG. 2 schematically illustrates a cross-sectional view of a semiconductor package in accordance with the disclosure.

FIG. 2 schematically illustrates a cross-sectional view of a semiconductor package 200 in accordance with the disclosure. The semiconductor package 200 may include a laminate 1 and a first semiconductor chip 2 that may be at least partly embedded in the laminate 1. The semiconductor package 200 may further include a second semiconductor chip 3 and an electrical contact 5 each of which may be arranged over or on a first main surface 4 of the laminate 1. The second semiconductor chip 3 may be electrically coupled to the electrical contact 5. Again, an explicit illustration of the electrical coupling is omitted due to reasons explained above. The semiconductor package 200 may further include an encapsulation material 6 that may at least partly encapsulate the second semiconductor chip 3, the electrical contact 5 and the laminate 1. More detailed semiconductor packages similar to the semiconductor package 200 of FIG. 2 are described below.

Figure 3:
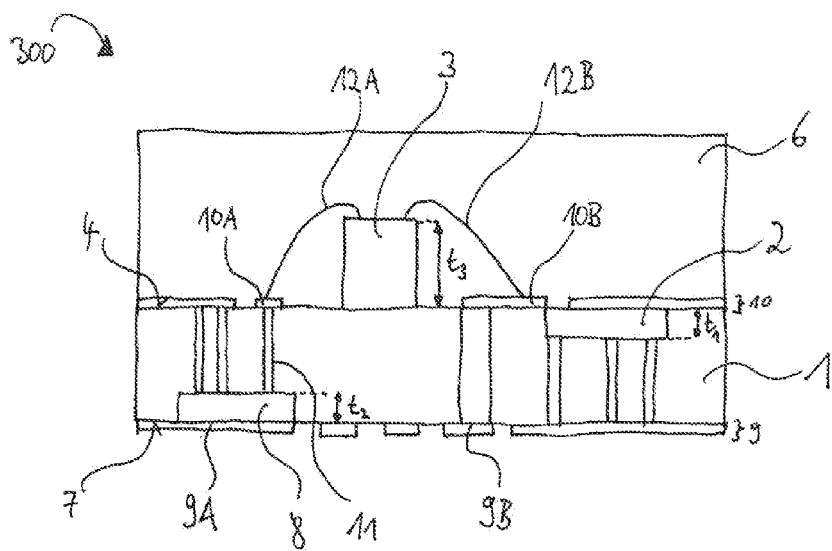
FIG. 3 schematically illustrates a cross-sectional view of a semiconductor device in accordance with the disclosure.

FIG. 3 schematically illustrates a cross-sectional view of a semiconductor device 300 in accordance with the disclosure. The semiconductor device 300 may include a laminate 1 having a first main surface 4 and a second main surface 7 opposite to the first main surface 4. The laminate 1 may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, etc. A thickness of the laminate 1 in a direction perpendicular to the main surfaces 4, 7 may lie in a range from about 60 μm (micrometer) to about 250 μm (micrometer).

A first semiconductor chip 2 and a third semiconductor chip 8 may be at least partly embedded in the laminate 1. In general, the semiconductor chips 2, 8 may be of arbitrary type. In particular, one or both of the semiconductor chips 2, 8 may include a power semiconductor. For example, each of the first semiconductor chips 2, 8 may be a MOSFET chip having a gate electrode and a source electrode arranged over or on a main surface of the respective semiconductor chip and a drain electrode arranged over or on an opposite main surface of the respective semiconductor chip. The main surfaces of the semiconductor chips 2, 8 including the gate electrode and the source electrode may be defined as active sides of the semiconductor chips 2, 8. In one example, the active side of the first semiconductor chip 2 may face in a direction towards the second main surface 7 of the laminate 1 while the active side of the third semiconductor chip 8 may face in a direction towards the first main surface 4 of the laminate 1. In further examples, the active sides of both semiconductor chips 2, 8 may face in a same direction, for example towards the first main surface 4 of the laminate 1 or towards the second main surface 7 of the laminate 1.

The semiconductor device 300 may include a first wiring layer (or first electrically conductive layer) 9 that may be arranged over or on the second main surface 7 of the laminate 1. A thickness of the first wiring layer 9 in a direction perpendicular to the main surfaces 4, 7 may lie in a range from about 5 μm (micrometer) to about 50 μm (micrometer). The first wiring layer 9 may be made of any appropriate electrically conductive material and may be structured depending on electrical connections that may be required for a desired operation of the semiconductor device 300. For example, a drain electrode of the third semiconductor chip 8 may be electrically connected to a part 9A of the first wiring layer 9 such that the drain electrode may be accessed from outside the laminate 1 via the part 9A of the first wiring layer 9. A further part 9B of the wiring layer 9 may e.g. provide an electrical connection to a through-connection that may extend from the first main surface 4 of the laminate 1 to the second main surface 7 of the laminate 1. Further parts of the first wiring layer 9 may be configured to provide an electrical connection with further electrical contacts of the first semiconductor chip 2 and/or the third semiconductor chip 8. In particular, the semiconductor device 300 may be designed such that all electrical contacts of the semiconductor chips 2, 8 may be accessed from outside (or a periphery) of the semiconductor device 300. In particular, the first wiring layer 9 may be configured to support a surface mount soldering technique. That is, the semiconductor device 300 may be a surface mount device and at least apart of the first wiring layer 9 may be configured to support a surface mounting of the semiconductor device 300 over or on another component (not illustrated), for example a Printed Circuit Board (PCB).

The semiconductor device 300 may include a second wiring layer (or second electrically conductive layer) 10 that may be arranged over or on the first main surface 4 of the laminate 1. A thickness of the second wiring layer 10 in a direction perpendicular to the main surfaces 4, 7 may lie in a range from about 5 μm (micrometer) to about 50 μm (micrometer). The second wiring layer 10 may be structured depending on electrical connections that may be required for a desired operation of the semiconductor device 300. For example, the second wiring layer 10 may include electrical contacts 10A, 10B arranged over or on the first main surface 4 of the laminate 1. For example, the electrical contact 10A may provide an electrical connection to an electrode arranged over or on a main surface of the third semiconductor chip 8 by means of e.g. a microvia 11. Further microvias may provide an electrical contact with further electrical contacts of the third semiconductor chip 8. In one example, the electrical contact 10B may provide an electrical connection to a through-connection that may extend through the laminate 1 from the first main surface 4 of the laminate 1 to the second main surface 7 of the laminate 1. The second wiring layer 10 may be made of any appropriate electrically conductive material. In particular, the material of the second wiring layer 10 may depend on how an electrical connection to parts of the second wiring layer 10 shall be established. In the example of FIG. 3, the second wiring layer 10 may particularly be configured to support a wire bonding process in which parts of the second wiring layer 10 may be electrically coupled to bond wires.

The semiconductor device 300 may include a second semiconductor chip 3 arranged over or on the first main surface 4 of the laminate 1. In general, the second semiconductor chip 3 may be of arbitrary type. In particular, the second semiconductor chip 3 may be configured to control and/or drive one or both of the semiconductor chips 2, 8 embedded in the laminate 1. In this case, the second semiconductor chip 3 may be or may include a logic chip. The second semiconductor chip 3 may be electrically connected to the part 10A of the second wiring layer 10 via a first bond wire 12A. This way, the second semiconductor chip 3 may e.g. have access to an electrode of the third semiconductor chip 8. In addition, the second semiconductor chip 3 may be electrically connected to the part 10B of the second wiring layer 10 via a second bond wire 10B. This way, the second semiconductor chip 3 may e.g. have access to an electrode of the first semiconductor chip 2.

The second semiconductor chip 3 may include a more complex circuitry than each of the semiconductor chips 2, 8 embedded in the laminate 1. For example, the second semiconductor chip 3 may have a high pin count while one or both of the semiconductor chips 2, 8 may have a low pin count. In addition, each of a thickness $t_1$ of the first semiconductor chip 2 and a thickness $t_2$ of the third semiconductor chip 8 may be smaller than a thickness $t_3$ of the second semiconductor chip 3. For example, the thickness $t_1$ of the first semiconductor chip 2 and the thickness $t_2$ of the third semiconductor chip 8 may be smaller than about 120 μm (micrometer). The thickness $t_3$ of the second semiconductor chip 3 may e.g. be larger than about 100 μm (micrometer). The thicknesses $t_1$, $t_2$, $t_3$ may differ from each other, but may also be equal.

The semiconductor device 300 may include an encapsulation material 6 that may be arranged over the first main surface 4 of the laminate 1. The encapsulation material 6 may include at least one of an epoxy, a glass fiber filled epoxy, a glass fiber filled polymer, an imide, a thermoplastic polymer material, a duroplastic polymer material, a polymer blend, a thermosetting material, a mold compound, a glob-top material, a laminate material, etc. A thickness of the encapsulation material 6 in a direction perpendicular to the main surfaces 4, 7 may lie in a range from about 100 μm (micrometer) to about 1000 μm (micrometer). The encapsulation material 6 may at least partly encapsulate at least one of the laminate 1, the second wiring layer 10, the bond wires 12A, 12B, the second semiconductor chip 3. In the example of FIG. 3, the encapsulation material 6 may cover all components arranged over the first main surface 4 of the laminate 1. The encapsulated semiconductor device 300 may thus represent a full system in package or one package solution.

In one example, the semiconductor device 300 may be configured to operate as a DC/DC converter that may be based on a half bridge circuit. Since FIG. 3 is of qualitative character, it does not necessarily illustrate all electrical connections that may be required for actually operation of a half bridge circuit. However, an exemplary schematic diagram of a half bridge circuit 1100 that may be implemented by a semiconductor device similar to the one of FIG. 3 is described in connection with FIG. 11. When using the multichip device 300 of FIG. 3 as a half bridge circuit, the first semiconductor chip 2 may include a low side switch, and the third semiconductor chip 8 may include a high side switch. In particular, a drain electrode of the first semiconductor chip 2 may be electrically connected to a source electrode of the third semiconductor chip 8.

As already mentioned, FIG. 3 is of qualitative character and further electronic functionalities that may differ from a DC/DC converter including a half bridge circuit may also be implemented on the basis of the semiconductor device 300. For this purpose, additional semiconductor chips may be included in the semiconductor device 300. In particular, the semiconductor device 300 may include an arbitrary number of semiconductor chips embedded in the laminate 1 and an arbitrary number of semiconductor chips arranged over or on the first main surface 4 of the laminate 1. The specific number of employed semiconductor chips and associated electrical connections provided between the semiconductor chips and/or the wiring layers 9 and 10 may depend on a desired functionality of the semiconductor device 300. Further, components may not only be contacted via the first wiring layer 9 arranged over or on the first main surface 7 of the laminate 1. For example, each of the first wiring layer 9 and the second wiring layer 10 may also be accessed from a side surface of semiconductor device 300. In the example of FIG. 3, the side surfaces of the semiconductor device 300 are substantially perpendicular to the main surfaces 4, 7 of the laminate 1, respectively.

Figure 4:
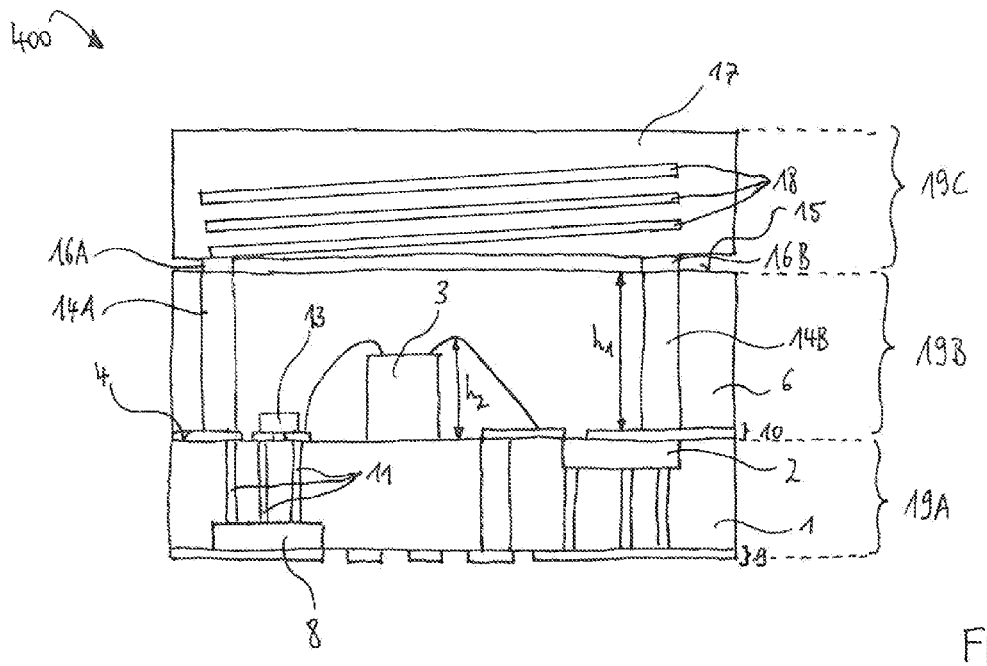
FIG. 4 schematically illustrates a cross-sectional view of a semiconductor device in accordance with the disclosure.

FIG. 4 schematically illustrates a cross-sectional view of a semiconductor device 400 in accordance with the disclosure. The semiconductor device 400 may be similar to the semiconductor device 300 of FIG. 3 and may include similar components. All comments made in connection with FIG. 3 may thus also hold true for the semiconductor device 400 of FIG. 4.

The semiconductor device 400 may include an electronic component 13 that may be arranged over or on the first main surface 4 of the laminate 1. For example, the electronic component 13 may include at least one of a passive electronic component, an active electronic component, a microelectromechanical component, etc. In the example of FIG. 4, only one exemplary electronic component 13 is illustrated. In further examples, the semiconductor device 400 may include an arbitrary number of further electronic components that may be arranged over or on the first main surface 4 of the laminate 1, wherein an arrangement and choice of employed electronic components may depend on a desired operation of the semiconductor device 400. For the exemplary case of the semiconductor device 400 operating as a DC/DC converter, the electronic component 13 may e.g. include a boot capacitor. The electronic component 13 may be electrically coupled to one or more of the other components of the semiconductor device 400. In the example of FIG. 4, the electronic component 13 may be coupled to the third semiconductor chip 8, for example by means of one or more microvias 11. In addition, the electronic component 13 may be coupled to the second semiconductor chip 3, for example by means of the second wiring layer 10. Similar to further components arranged over the first main surface 4 of the laminate 1, the electronic component 13 may be at least partly encapsulated by the encapsulation material 6.

The semiconductor device 400 may further include one or more electrically conductive elements 14A, 14B that may extend through the encapsulation material 6. In the example of FIG. 4, two electrically conductive elements 14A, 14B may extend from the first main surface 4 of the laminate 1 to the upper surface 15 of the encapsulation material 6, respectively. The electrically conductive elements 14A, 14B may e.g. be blocks made of a metal or metal alloy, for example Cu, and may be electrically coupled to the second wiring layer 10, for example by means of a soldering technique. A height $h_1$ of the electrically conductive elements 14A, 14B may be larger than a height $h_2$ of the second semiconductor chip 3 and the wire loops of the bond wires 12A, 12B. The electrically conductive elements 14A, 14B may be at least partly encapsulated by the encapsulation material 6. In the example of FIG. 4, the electrically conductive elements 14A, 14B may be completely covered by the encapsulation material 6, except their upper surfaces.

The electrically conductive elements 14A, 14B may be exposed on the upper surface 15 of the encapsulation material 6. For example, exposing the electrically conductive elements 14A, 14b may be achieved by first encapsulating the electrically conductive elements 14A, 14B with the encapsulation material 6 and removing parts of the encapsulation material 6 from the upper surface 15 of the encapsulation material 6 afterwards until the upper sides of the electrically conductive elements 14A, 14B become exposed. In this connection, a grinding process may be used, for example. Each of the electrically conductive elements 14A, 14B may provide an opportunity to electrically contact the second wiring layer 10 from the upper surface 15 of the encapsulation material 6. This way, one or more of the semiconductor chips 2, 3, 8 may be electrically contacted via the electrically conductive elements 14A, 14B.

The semiconductor device 400 may further include electrical contacts 16A, 16B that may be arranged over or on the exposed surfaces of the electrically conductive elements 14A, 14B. For example, the electrical contacts 16A, 16B may be made of one or more layers of a metal and/or a metal alloy. In addition, the semiconductor device 400 may include an electronic component 17 that may be mounted over or on the main surface 15 of the encapsulation material 6. For example, the electronic component 17 may include at least one of a passive electronic component, an active electronic component, a microelectromechanical component, etc. The electrical contacts 16A, 16B may improve an electrical connection and/or heat conductivity/transfer between the exposed surfaces of the electrically conductive elements 14A, 14B and electrical contacts of the electronic component 17. Since the electrical contacts 16A, 16B may extend over the surface 15 of the encapsulation material 6, a gap may occur between the encapsulation material 6 and the electronic component 17.

For the exemplary case of the semiconductor device 400 operating as a DC/DC converter, the electronic component 17 may e.g. include a current storage inductor that may be required for a DC/DC conversion. In FIG. 4, coils 18 of such current storage inductor are exemplarily indicated by parallel lines. The electronic component 17 may be electrically coupled to the electrically conductive elements 14A, 14B via the electrical contacts 16A, 16B. In a further example, copper or aluminum blocks may be mounted over the surface 15 of the encapsulation material 6 and may serve as a heat pipe providing a top side cooling in order to improve a thermal performance of the semiconductor device 400.

The semiconductor device 400 may be seen as a semiconductor package having a three layer system. In a first layer 19A, electronic functionalities may be implemented by means of one or more semiconductor chips at least partly embedded in the laminate 1. In a second layer 19B, electronic functionalities may be implemented by means of one or more semiconductor chips and/or one or more electronic components arranged over or on the laminate 1 and at least partly encapsulated by the encapsulation material 6. In a third layer 19C, further electronic components may be mounted over or on the encapsulation material 6 providing further electronic functionalities. As can be seen from previous comments, components contained in the individual layers 19A to 19C may interact with one another during an operation of the semiconductor device 400. The combination of the three layers 19A to 19C may represent a one package solution.

Figure 5:
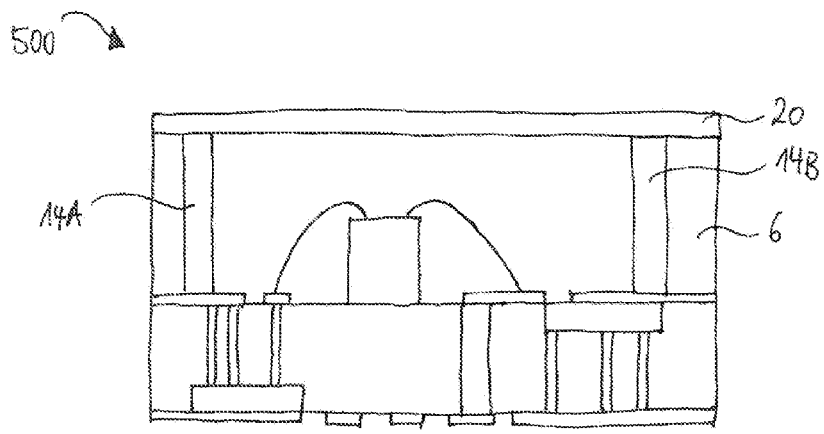
FIG. 5 schematically illustrates a cross-sectional view of a semiconductor device in accordance with the disclosure.

FIG. 5 schematically illustrates a cross-sectional view of a semiconductor device 500 in accordance with the disclosure. The semiconductor device 500 may e.g. be similar to the semiconductor device 400 of FIG. 4 and may include similar components. All comments made in connection with FIG. 4 may thus also hold true for the semiconductor device 500 of FIG. 5.

In FIG. 5 the electrical contacts 16A, 16B and the electronic component 17 of FIG. 4 may be replaced by an electromagnetic shielding 20 that may be arranged over the encapsulation material 6. The electromagnetic shielding 20 may be electrically connected to the electrically conductive elements 14A, 14B. For example, the electromagnetic shielding 20 may include at least one of copper blocks, copper rings, sputtered copper, plated copper, etc. In other examples, similar metals or metal alloys may be employed for manufacturing the electromagnetic shielding 20. In particular, the electromagnetic shielding 20 may be connected to a ground potential.

Figure 6:
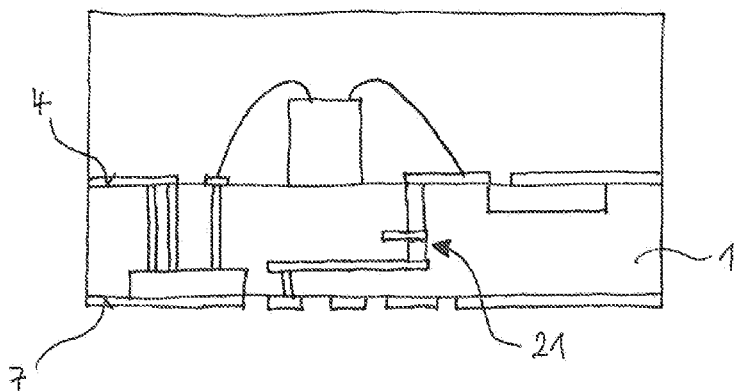
FIG. 6 schematically illustrates a cross-sectional view of a semiconductor device in accordance with the disclosure.

FIG. 6 schematically illustrates a cross-sectional view of a semiconductor device 600 in accordance with the disclosure. The semiconductor device 600 may be similar to one of the previously described semiconductor devices such that previous comments also may hold true in connection with FIG. 5.

The semiconductor device 600 may include one or more redistribution layers that may be arranged over the first main surface 4 of the laminate 1 and/or over the second main surface 7 of the laminate 1 and/or at least partly inside the laminate 1. In the example of FIG. 6, an exemplary redistribution layer 21 may extend through the laminate 1 from the first main surface 4 of the laminate 1 to the second main surface 7 of the laminate 1. The number and the arrangement of formed redistribution layers may particularly depend on a desired functionality of the semiconductor device 600.

Figure 7:
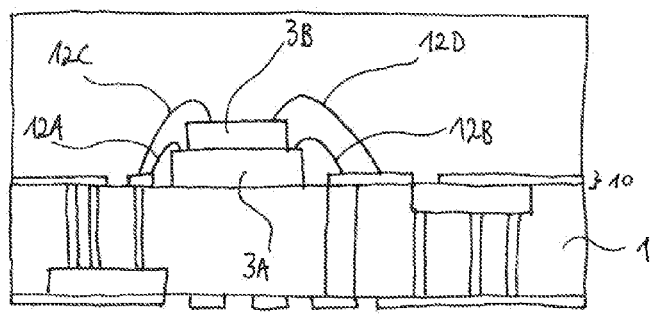
FIG. 7 schematically illustrates a cross-sectional view of a semiconductor device in accordance with the disclosure.

FIG. 7 schematically illustrates a cross-sectional view of a semiconductor device 700 in accordance with the disclosure. The semiconductor device 700 may be similar to one of the previously described semiconductor devices such that previous comments also may hold true in connection with FIG. 6.

The semiconductor device 700 may include a semiconductor chip 3A arranged over or on the first main surface 4 of the laminate 1. The semiconductor chip 3A may be of arbitrary type and may, for example, be similar to the semiconductor chip 3 of FIG. 3. The semiconductor chip 3A may be electrically connected to parts of the second wiring layer 10 via bond wires 12A, 12B such that e.g. an electrical connection between the semiconductor chip 3A and one or more semiconductor chips embedded in the laminate 1 and/or the second wiring layer 10 may be established.

The semiconductor device 700 may include a further semiconductor chip 3B arranged over or on the semiconductor chip 3A. The semiconductor chip 3B may be of arbitrary type and may, for example, be similar to the semiconductor chip 3 of FIG. 3. The semiconductor chip 3B may be electrically connected to parts of the wiring layer 10 via bond wires 12C, 12D such that an electrical connection between the semiconductor chip 3B and one or more semiconductor chips embedded in the laminate 1 and/or the second wiring layer 10 may be established. In addition, the stacked semiconductor chips 3A, 3B may be electrically connected with each other, for example at the contact surface between the semiconductor chips 3A, 3B. Alternatively, an electrically insulating layer (not illustrated) may be arranged between the semiconductor chips 3A, 3B.

Figure 8:
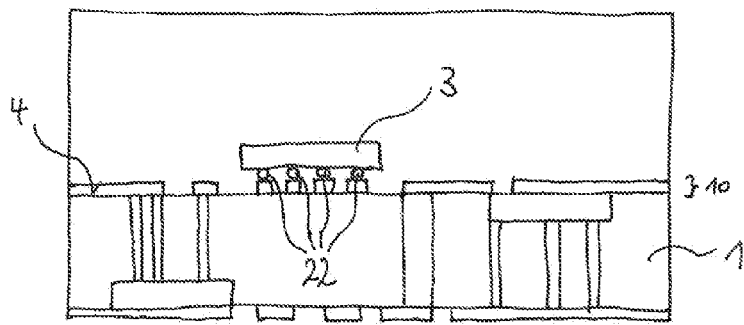
FIG. 8 schematically illustrates a cross-sectional view of a semiconductor device in accordance with the disclosure.

FIG. 8 schematically illustrates a cross-sectional view of a semiconductor device 800 in accordance with the disclosure. For example, the semiconductor device 800 may be similar to the semiconductor device 300 of FIG. 3. In contrast to FIG. 3, the semiconductor chip 3 arranged over or on the first main surface 4 of the laminate 1 may not necessarily be connected to the second wiring layer 10 via bond wires 12A, 12B. Instead, the semiconductor chip 3 may be arranged in a flip-chip manner such that an electrical connection between electrical contacts arranged over or on the lower surface of the semiconductor chip 3 and electrical contacts of the second wiring layer 10 may be established via (flowed) solder elements 22 (or solder balls or solder bumps).

Figure 9:
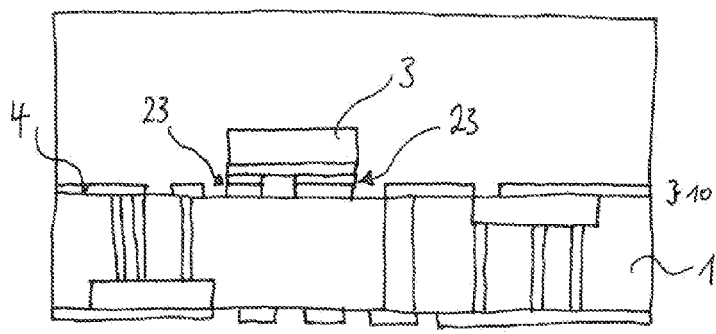
FIG. 9 schematically illustrates a cross-sectional view of a semiconductor device in accordance with the disclosure.

FIG. 9 schematically illustrates a cross-sectional view of a semiconductor device 900 in accordance with the disclosure. For example, the semiconductor device 900 may be similar to one of the semiconductor devices 300 and 800 in FIGS. 3 and 8. In contrast to FIG. 3, the semiconductor chip 3 arranged over the first main surface 4 of the laminate 1 may not necessarily be connected to the second wiring layer 10 via bond wires 12A, 12B. Instead, an electrical connection between the semiconductor chip 3 and electrical contacts of the second wiring layer 10 may be established by means of a diffusion soldering process. When performing such diffusion soldering process, a solder material may either be applied over or on a surface of the semiconductor chip 3, over or on the first main surface 4 of the laminate 1, or over or on both. Here, any solder material capable of forming diffusion solder bonds may be used, for example solder material comprising one or more of Sn, SnAg, SnAu, In, InAg, InAu, etc. The diffusion solder bonds may include one or more soldered layers that may be made of a same or different solder materials. In a further example, a packaged chip may be mounted over or on the first main surface 4 of the laminate, for example by using a surface mount technique.

Figure 10A:
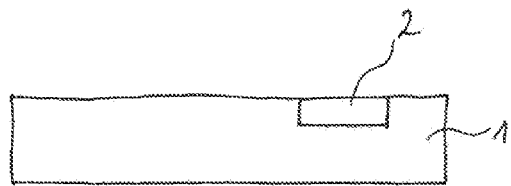
FIGS. 10A to 10D schematically illustrate a cross-sectional view of a method for manufacturing a semiconductor device in accordance with the disclosure.
Figure 10B:
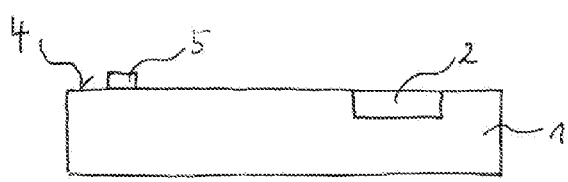
Figure 10C:
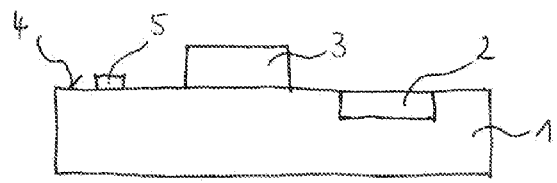
Figure 10D:
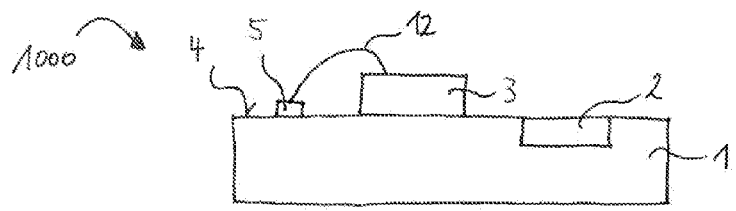

FIGS. 10A to 10D schematically illustrate a cross-sectional view of a method for manufacturing a multichip device 1000 in accordance with the disclosure. A cross section of a semiconductor device 1000 obtained by the method is illustrated in FIG. 10D. For example, the semiconductor device 1000 may be similar to the semiconductor device 100 of FIG. 1. However, the described method may also provide a basis for manufacturing any of the semiconductor devices in accordance with the disclosure as described herein. In FIG. 10A, a first semiconductor chip 2 may be embedded in a laminate 1. In FIG. 10B, an electrical contact 5 may be formed over or on a first main surface 4 of the laminate 1. In FIG. 10C, a second semiconductor chip 3 may be mounted over or on the first main surface 4 of the laminate 1. In FIG. 10D, the second semiconductor chip 3 may be electrically coupled to the electrical contact 5. In the example of FIG. 10D, the electrical coupling between the second semiconductor chip 3 and the electrical contact 5 is illustrated by an exemplary bond wire 12. However, the electrical coupling may also be provided by any other electrical coupling as described herein.

The described method may include further acts that are not explicitly illustrated herein for the sake of simplicity. For example, the second semiconductor chip 3, the electrical contact 5 and the laminate 1 may at least partly be encapsulated by an encapsulation material. The resulting device may then e.g. be similar to the device 200 of FIG. 2. In further examples, any of the components described in connection with FIGS. 3 to 9 may be added to the semiconductor device 1000.

The semiconductor devices in accordance with the disclosure as described herein may have the following effects. These effects may particularly become apparent when comparing a semiconductor device in accordance with the disclosure with semiconductor devices providing a similar functionality, but including multiple chip devices instead of representing a one package solution. The listed effects are neither exclusive nor limiting.

Compared to other semiconductor devices, a semiconductor device in accordance with the disclosure may provide an increased degree of integration.

Compared to other semiconductor devices, a semiconductor device in accordance with the disclosure may be smaller.

Employing features described in connection with methods and/or semiconductor devices in accordance with the disclosure may provide an increased freedom of design when implementing semiconductor devices of a desired functionality.

Compared to other semiconductor devices, a semiconductor device in accordance with the disclosure may provide an improved electrical and/or thermal performance, in particular with regard to stray inductance, capacitance, efficiency, etc.

Figure 11:
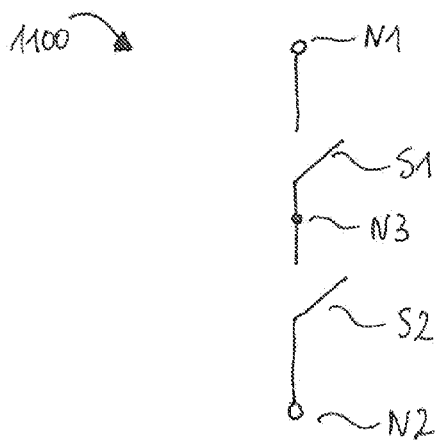
FIG. 11 illustrates a schematic diagram of a half bridge circuit.

FIG. 11 illustrates a schematic diagram of a half bridge circuit 1100. A semiconductor device in accordance with the disclosure may be configured to operate as such half bridge circuit. The half bridge circuit 1100 may be arranged between nodes N1 and N2. The half bridge circuit may include switches S1 and S2 connected in series. The power semiconductor chips 2 and 8, as e.g. shown in FIG. 3 of the semiconductor device 300, may be implemented as the switches S1 and S2. Constant electrical potentials may be applied to the nodes N1 and N2. For example, a high potential, such as 10, 12, 18, 50, 110, 230, 500 or 1000 V or any other potential, may be applied to the node N1 and a low electrical potential, for example 0 V, may be applied to the node N2. Thus, the first semiconductor chip 2 may be configured to act as the low side switch, whereas the third semiconductor chip 8 may be configured to act as the high side switch. The switches S1 and S2 may be switched at frequencies in the range from 1 kHz to 100 MHz, but the switching frequencies may also be outside this range. This means that a varying electrical potential may be applied to a node N3 arranged between the switches S1 and S2 during an operation of the half bridge. The potential of the node N3 may vary in the range between the low and the high electrical potential.

The half bridge circuit may, for example, be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 100 A or even higher may flow through the DC-DC converters.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure be limited only by the claims and the equivalents thereof.

What is claimed is:

1. A semiconductor device, comprising:
   a laminate;
   a first power semiconductor chip at least partly embedded in the laminate;
   a second power semiconductor chip at least partly embedded in the laminate;
   a control semiconductor chip configured to control at least one of the first power semiconductor chip and the second power semiconductor chip, the control semiconductor chip mounted on a first main surface of the laminate; and
   a first electrical contact arranged on the first main surface of the laminate, wherein the control semiconductor chip is electrically coupled to the first electrical contact.

2. The semiconductor device of claim 1, wherein the laminate comprises at least one of an epoxy, a glass fiber filled epoxy, a glass fiber filled polymer, an imide, a filled or non-filled thermoplastic polymer material, a filled or non-filled duroplastic polymer material, and a polymer blend.

3. The semiconductor device of claim 1, further comprising:
   an encapsulation material at least partly encapsulating the laminate and the control semiconductor chip.

4. The semiconductor device of claim 3, wherein the encapsulation material comprises at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a mold compound, a glob-top material, and a laminate material.

5. The semiconductor device of claim 1, wherein the control semiconductor chip is electrically coupled to the first electrical contact by at least one of a bond wire, a solder connection, a diffusion solder bond, and a conductive glue.

6. The semiconductor device of claim 1, further comprising:
   a second electrical contact arranged on a main surface of the laminate, wherein the first semiconductor chip is electrically coupled to the second electrical contact by a microvia.

7. The semiconductor device of claim 1, further comprising:
   at least one of a passive electronic component, an active electronic component, and a microelectromechanical component mounted on a surface of the laminate.

8. The semiconductor device of claim 1, wherein the first semiconductor chip comprises a power semiconductor.

9. The semiconductor device of claim 1, wherein the control semiconductor chip is configured to control and/or drive the first semiconductor chip.

10. The semiconductor device of claim 1, wherein a thickness of the first semiconductor chip is less than 120 micrometer.

11. The semiconductor device of claim 1, wherein a thickness of the control semiconductor chip is greater than 100 micrometer.

12. The semiconductor device of claim 1, wherein the first semiconductor chip has a lower pin count than the control semiconductor chip.

13. The semiconductor device of claim 1, further comprising:
   a third semiconductor chip at least partly embedded in the laminate.

14. The semiconductor device of claim 13, wherein an active side of the first semiconductor chip faces in a first direction and an active side of the third semiconductor chip faces in a second direction opposite to the first direction.

15. The semiconductor device of claim 14, further comprising:
   a half bridge circuit comprising a high side switch and a low side switch, wherein the first semiconductor chip comprises the high side switch and the third semiconductor chip comprises the low side switch.

16. The semiconductor device of claim 1, further comprising:
   an additional electrical contact arranged on a second main surface of the laminate opposite to the first main surface of the laminate, wherein the semiconductor device is a surface mount device and the additional electrical contact is configured to support a surface mounting of the semiconductor device.

17. The semiconductor device of claim 3, further comprising:
   an electrically conductive element extending through the encapsulation material and configured to provide an electrical coupling between the first main surface of the laminate and a main surface of the encapsulation material.

18. The semiconductor device of claim 17, further comprising:

an electronic component mounted on the main surface of the encapsulation material and electrically coupled to the electrically conductive element.

19. The semiconductor device of claim 1, further comprising:
a redistribution layer arranged over at least one surface of the laminate and/or in the laminate.

20. The semiconductor device of claim 17, further comprising:
an electromagnetic shielding arranged over the electrically conductive element.

21. A semiconductor package, comprising:
a laminate;
an electrical contact arranged on a first main surface of the laminate;
at least one power semiconductor chip at least partly embedded in the laminate;
a control semiconductor chip configured to control the at least one power semiconductor chip, the control semiconductor chip arranged on the first main surface of the laminate and electrically coupled to the electrical contact, wherein each power semiconductor chip controlled by the control semiconductor chip is embedded in the laminate; and
an encapsulation material at least partly encapsulating the control semiconductor chip, the electrical contact and the laminate.

22. A method, comprising:
embedding a first semiconductor chip and a second power semiconductor chip in a laminate;
forming an electrical contact on a first main surface of the laminate;
mounting a control semiconductor chip on the first main surface of the laminate, the control semiconductor chip configured to control at least one of the first power semiconductor chip and the second power semiconductor chip; and
electrically coupling the control semiconductor chip to the electrical contact.

* * * * *

UNITED STATES PATENT AND TRADEMARK OFFICE
CERTIFICATE OF CORRECTION

PATENT NO.         : 9,263,425 B2
APPLICATION NO.    : 14/102625
DATED              : February 16, 2016
INVENTOR(S)        : Scharf et al.

Page 1 of 1

It is certified that error appears in the above-identified patent and that said Letters Patent is hereby corrected as shown below:

In the claims,

Column 16, line 9 (claim 22 line 2), please change "first semiconductor" to -- first power semiconductor --

Signed and Sealed this
Fourteenth Day of June, 2016

Michelle K. Lee
*Director of the United States Patent and Trademark Office*